United States Patent [19]

Mitani et al.

[11] Patent Number: 5,378,285
[45] Date of Patent: Jan. 3, 1995

[54] APPARATUS FOR FORMING A DIAMOND-LIKE THIN FILM

[75] Inventors: Tsutomu Mitani, Akashi; Hideo Kurokawa, Katano; Hirokazu Nakaue, Higashi-Osaka, all of Japan

[73] Assignee: Matsushita Electric Industrial Co., Ltd., Japan

[21] Appl. No.: 15,587

[22] Filed: Feb. 10, 1993

[51] Int. Cl.⁶ .............................................. C23C 16/26
[52] U.S. Cl. ...................... 118/723 HC; 118/723 ER; 118/723 IR; 117/929
[58] Field of Search .................. 118/723 HC, 723 IB, 118/723 ER; 156/DIG. 48

[56] References Cited

U.S. PATENT DOCUMENTS 5,058,527  10/1991  Ohta et al. ................ 118/723 HC

FOREIGN PATENT DOCUMENTS 2-274876  11/1990  Japan.
3-274269  12/1991  Japan.
3-274270  12/1991  Japan.
60-65796  10/1992  Japan.
4-304375  10/1992  Japan.
4-318172  11/1992  Japan.

OTHER PUBLICATIONS

Catherine, "Preparation Techniques for Diamond-like Carbon", from Diamond and Diamond-like Films and Coatings, pp. 193–227 (1991).

Freeman, "The epitaxial synthesis of diamond by the deposition of low energy carbon ions", vacuum, vol. 34, No. 1–2, pp. 305–314 (1984).

Okada et al., Proceeding of 36th Meeting of Applied Physics 1p-H-14; published Apr. 1, 1989.

*Primary Examiner*—R. Bruce Breneman
*Assistant Examiner*—Jonathan D. Baskin
*Attorney, Agent, or Firm*—Wenderoth, Lind & Ponack

[57] ABSTRACT

A diamond-like thin film of good quality is prepared homogeneously and fast in a deposition. A mesh-like acceleration electrode is provided at the opening of a chamber including a filament, and a plasma is generated in the chamber. Because the chamber is isolated electrically from the electric system of the apparatus, the high density and the equilibrium state are maintained, and the plasma density and the potential are homogenized around the mesh-like electrode. In this state, a bias potential is applied to the substrate, and the ions are accelerated according to the potential difference between the plasma and the substrate to deposit a diamond-like thin film on the substrate. Preferably, a negative potential electrode is provided before or around the substrate. Further, an insulating member is provided to surround a flight path of ions between the chamber and the substrate.

16 Claims, 11 Drawing Sheets

APPARATUS FOR FORMING A DIAMOND-LIKE THIN FILM

BACKGROUND OF THE INVENTION

1. Field of the Invention

The present invention relates to an apparatus for forming a diamond-like thin film by using ionized particles of hydrocarbon gas.

2. Description of the Prior Art

A diamond-like thin film has physical properties similar to those of diamond, and it is applied to various electronics devices. Various kinds of apparatuses of depositing a diamond-like thin film are disclosed already. Among them, an apparatus disclosed in Japanese Patent laid open Publication No. 65,796/1985 shown in FIG. 1 has a relatively simple structure.

Figure 1:
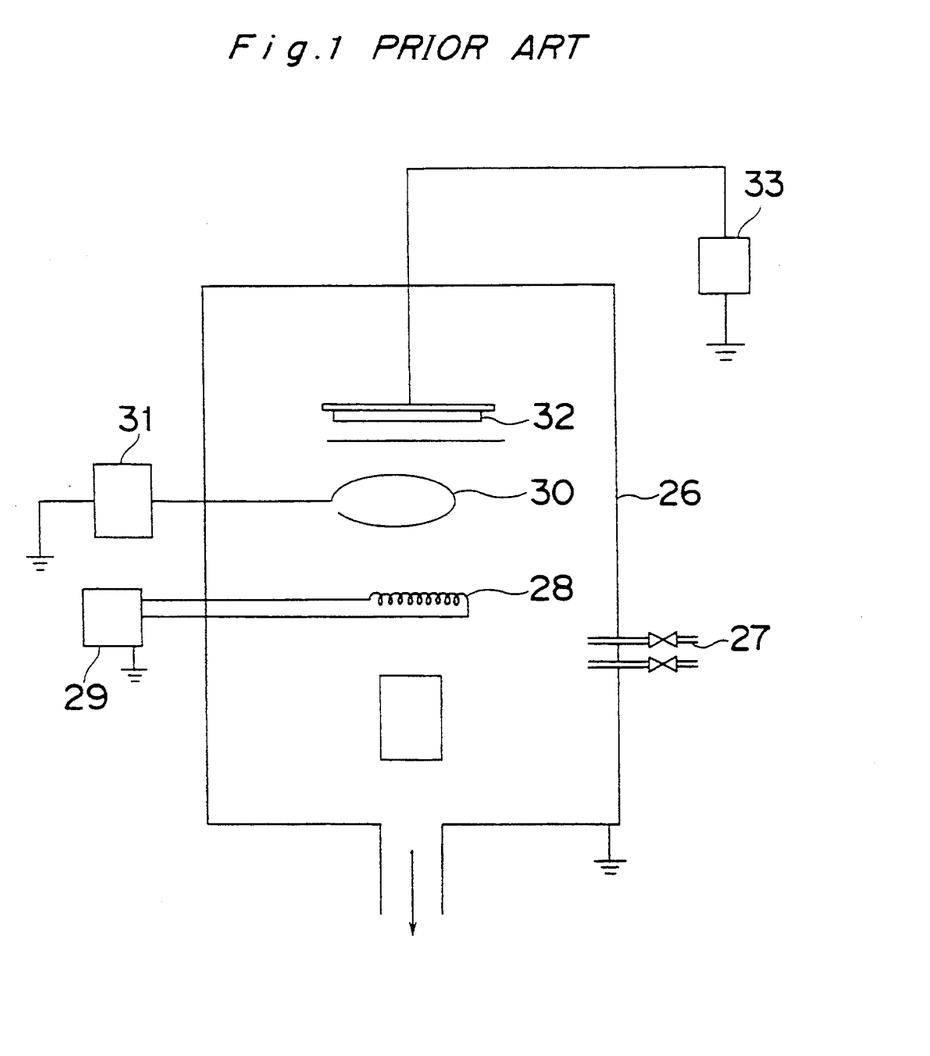
FIG. 1 is a diagram of a prior art synthesis apparatus of diamond-like thin film.

In the prior art apparatus, after ethylene gas 27 is supplied to a vacuum chamber 26, a filament 28 is heated with an electric power source 29 for generating thermoelectrons. At the same time, a positive electric potential is applied to an acceleration electrode 30 to accelerate the thermoelectrons. Then, the thermoelectrons collide with the ethylene gas to generate a plasma (not shown) of the ethylene gas. The plasma includes many ionized particles of the hydrocarbon gas. By applying a negative electric potential to a substrate 32 for accelerating ionized particles, these ionized particles deposit on the substrate 32 to form a diamond-like thin film.

However, the above-mentioned prior art apparatus has problems on the film thickness, the film quality, the deposition rate, the spark-like anomalous discharge and the contamination of the vacuum chamber. That is, the film thickness and the film quality are difficult to be realized to be uniform. Still further, anomalous spark-like discharge is liable to arise in the vacuum chamber 26 though it depends on synthesis conditions, so that it becomes difficult to prepare a diamond-like film stably in some cases. Further, almost all of the vacuum chamber 26 is liable to be contaminated with a deposit, and the maintenance operation such as cleaning of the vacuum chamber 26 is troublesome.

In another example of a prior art apparatus for forming a diamond-like thin film by using ionized particles of hydrocarbon gas, a Kaufman type ion source is used to generate and accelerate ionized particles of hydrocarbon to deposit a diamond-like thin film on a substrate (refer the Proceeding of the 36-th Meeting of the Japanese Society of Applied Physics 1p-H-14). The prior art apparatus has an ionized particle generator such as the Kaufman type ion source including an ionization chamber provided in a vacuum chamber wherein a substrate is provided, and a plasma of hydrocarbon is generated in the ionization chamber. The ionized particles are accelerated by applying a negative high voltage to the substrate.

If the Kaufman type ion source is used, the plasma is contained in the ionization chamber and the ionized particles come to the substrate straightly as a beam, so that the plasma becomes harder to extend outside the ionization chamber in the vacuum chamber if compared with the abovementioned apparatus of the Japanese Patent laid open Publication No. 65,796/1985. Then, the film thickness, the film quality, the deposition rate, the spark-like anomalous discharge and the contamination of the vacuum chamber are improved.

However, in the Kaufman type ion source and the like, though the ionized particles fly to the substrate straightly as a beam, there are also ions which fly to components other than the substrate in the vacuum chamber. Especially when a diamond-like thin film is deposited on a wide area of substrate which has a size equal to or larger than the opening of the ionized particle generator, the film thickness becomes thinner towards the periphery of the substrate.

As explained above, the prior art apparatuses have problems to be solved such as the uniform film thickness and film quality, the deposition rate, the stable preparation and the maintenance of a diamond-like thin film.

SUMMARY OF THE INVENTION

An object of the present invention is to provide a an apparatus for forming a diamond-like thin film stably at a fast rate.

In an apparatus of diamond-like thin film according to the present invention, an ionized particle generator is provided in a vacuum chamber to generate a plasma of hydrocarbon with thermoelectrons generated from a heated filament. The ionized particle generator has an ionization chamber, and an acceleration electrode is arranged at an opening of the ionization chamber including the filament. The ionization chamber of the ionized particle generator is isolated electrically from the filament, the acceleration electrode and the ground.

In another aspect of the present invention, a negative potential electrode is provided around the substrate for smoothing the electric field around the substrate.

In a third aspect of the present invention, a member isolated electrically from the ground potential is provided for surrounding a space between an opening of the ionized particle generator and the substrate.

An advantage of the present invention is that a diamond-like thin film of good quality can be synthesized homogeneously, stably and fast.

Another advantage of the present invention is that the maintenance such as cleaning is easy.

A third advantage of the present invention is that the negative potential electrode arranged around the substrate serves to deposit a film of a more uniform thickness and of more uniform film quality.

A fourth advantage of the present invention is that the insulating member surrounding the periphery of the flight path of ionized particles can enhance the number of the ionized particles which arrive the substrate to improve the deposition rate.

BRIEF DESCRIPTION OF THE DRAWINGS

These and other objects and features of the present invention will become clear from the following description taken in conjunction with the preferred embodiments thereof with reference to the accompanying drawings, and in which:

FIG. 3(*a*) is a diagram of plasma density in the apparatus shown in FIG. 1, and FIG. 3(*b*) is a sectional view of a principal part of the apparatus with relation of the position of the plasma;

FIG. 4(*a*) is a diagram of the distribution of film thickness of film samples prepared in the apparatus, and FIG. 4(*b*) is a sectional view of a principal part of the apparatus with relation of the position of the plasma on the distribution of film thickness;

FIG. 13($a$) is a schematic partial sectional view of a second example of the second embodiment of an apparatus of forming a diamond-like thin film, FIG. 13($b$) is a sectional view of a substrate holder and substrates, and FIG. 13($c$) is a bottom view of the substrate holder and a negative potential electrode.

DETAILED DESCRIPTION OF THE PREFERRED EMBODIMENTS

Embodiments of the present invention are explained below with reference to the appended drawings. The above-mentioned problems of the prior art apparatuses are partly due to the extension of the plasma in the vacuum chamber. Further, when a negative potential is applied to the substrate, the electric field is liable to concentrate around the substrate. Thus, ionized particles are likely to concentrate around the substrate, so that the film thickness and film quality of diamond-like thin films are not uniform. Further, when the plasma extends in the entire vacuum chamber as mentioned above, the plasma density is small, and the ionization ratio of hydrocarbon is low. These problems are solved in the embodiments explained below.

First embodiment

Figure 2:
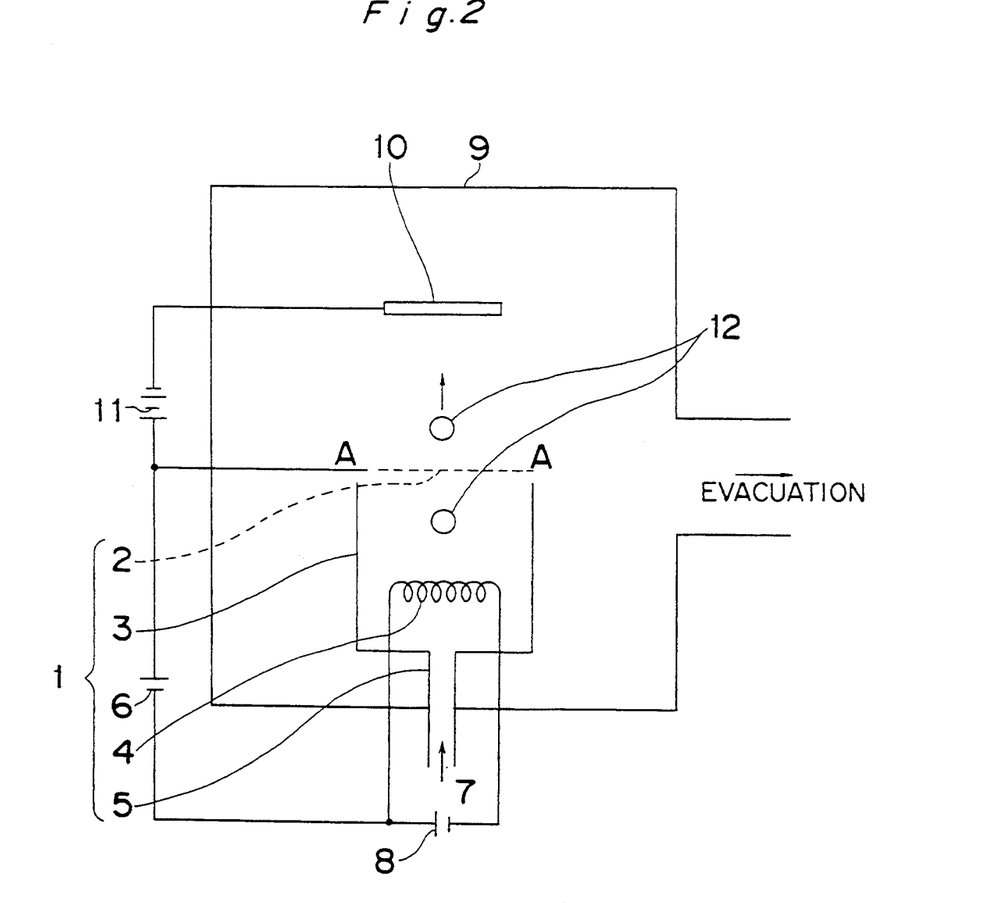
FIG. 2 is a schematic diagram of a first embodiment of a synthesis apparatus of diamond-like thin film.

FIG. 2 shows schematically an apparatus of forming a diamond-like thin film of the first embodiment. An ionized particle generator 1 is arranged in the center of a vacuum chamber 9, and it comprises an ionization chamber 3 connected to a material gas inlet 5 of hydrocarbon gas 7, a coil-like tungsten filament 4 provided inside the chamber 3 for generating thermoelectrons, and a mesh-like acceleration electrode 2 provided at the top of the ionization chamber 3. The chamber 3 is isolated from the ground potential of the electric system of the apparatus, the filament 4 and the acceleration electrode 2, and it is floated electrically. The chamber 3 may be made from an insulator or from a metal insulated electrically from the chamber 3 and the vacuum chamber 9. A substrate 1 fixed on a holder (not shown) is provided above the acceleration electrode 2 in the vacuum chamber 9. The vacuum chamber 9 can be evacuated with a vacuum pump (not shown).

A direct current power source 8 arranged outside the vacuum chamber 9 supplies a current to the filament 4 for heating to generate thermoelectrons in the ionization chamber 3. An electric power source 6 for accelerating thermoelectrons, arranged outside the vacuum chamber 9, applies a positive potential to the acceleration electrode 2 relative to the filament 4. An electric power source 11 for accelerating ionized particles, arranged outside the vacuum chamber 9, applies a negative potential to the substrate 10 relative to the acceleration electrode 2 to control the substrate potential.

Next, a synthesis procedure of film is explained. First, the vacuum chamber 9 including a substrate 10 and the chamber 3 are evacuated to $10^{-4}$ Torr with the vacuum pump (not shown). Next, a hydrocarbon gas 7 is introduced through the material gas inlet 5, and the gas pressure is controlled at a predetermined value, say $10^{-3}$ Torr, by controlling the gas flow rate. At the same time, a current is supplied by the electric power source 8 to the filament 4 for heating to generate thermoelectrons in the chamber 3. A positive potential is applied to the acceleration electrode 2, and thermoelectrons collide with hydrocarbon molecules to generate ionized particles 12 of benzene gas. When a negative potential is applied to the substrate 10, the ionized particles 12 with positive charges generated in the chamber 3 are accelerated toward the substrate 10 to be deposited on the substrate 10. Thus, a diamond-like thin film is synthesized on the substrate 10.

In the first embodiment according to the present invention, the filament (thermoelectron generator) 4 and the acceleration electrode 2 are provided in the chamber 3 of the ionized particle generator 1, and the plasma of hydrocarbon is generated in the ionized particle generator 1 so that it becomes harder to extend in the entire vacuum chamber 9. Thus, a high density of plasma can be generated.

Further, the chamber 3 of the ionized particle generator 1 is isolated electrically from the filament 4, the acceleration electrode 2 and the ground potential. The potential of the plasma is controlled by the acceleration electrode 2. Therefore, in the neighborhood of the acceleration electrode 2, the plasma density and the plasma potential can be made uniform according to the potential applied to the acceleration electrode 2. As a result, the density and the potential of the ions generated in the region also become uniform. Then, ionized particles of hydrocarbon arrive uniformly to the substrate 10 arranged opposite to the acceleration electrode 2. That is, the acceleration electrode 2 not only accelerates thermoelectrons from the filament 4 to generate a plasma in the ionized particle generator 1, but also makes the potential of the plasma uniform. Therefore, the film quality and the film thickness of the diamond-like thin film can be made uniform, while the deposition rate can be increased due to the high density of the plasma. Further, by controlling the potentials of the plasma and the substrate 10, a desired acceleration energy can be given to the ions, and a diamond-like thin film of good quality can be deposited. Further, the plasma is suppressed to extend in the entire vacuum chamber 9, so that the vacuum chamber is not likely to be contaminated.

The ionized particle generator 1 has no electric potential except the filament 4 and the acceleration electrode 2, the plasma is generated between the filament 4 and the acceleration electrode 2. The plasma discharges only to the mesh-like electrode 2, and the electric field in the plasma is formed all to the mesh-like electrode 2, to maintain the equilibrium state. Spark-like anomalous discharge is suppressed in the ionized particle generator 1 as well as in the vacuum chamber 9, and a diamond-like thin film of good quality can be deposited stably.

Figure 3A:
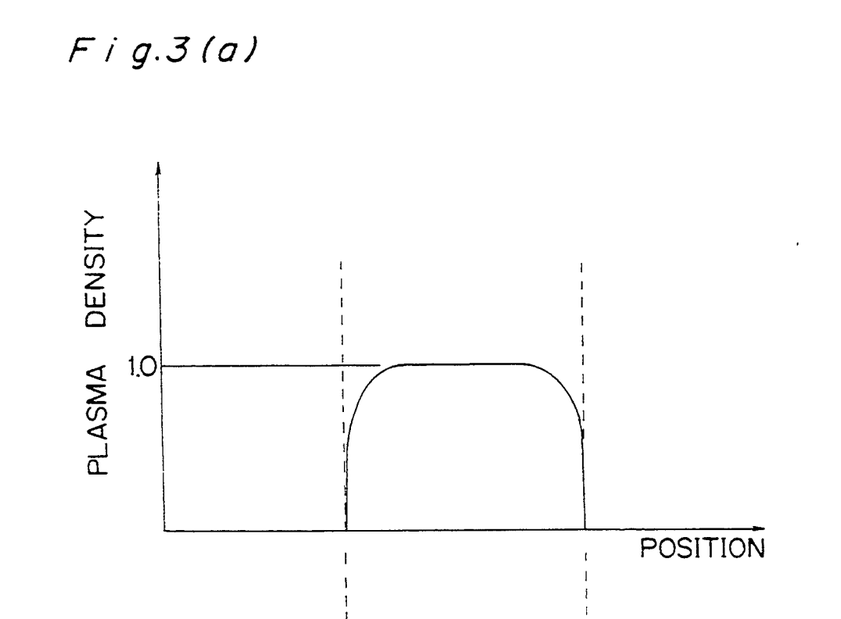
Figure 3B:
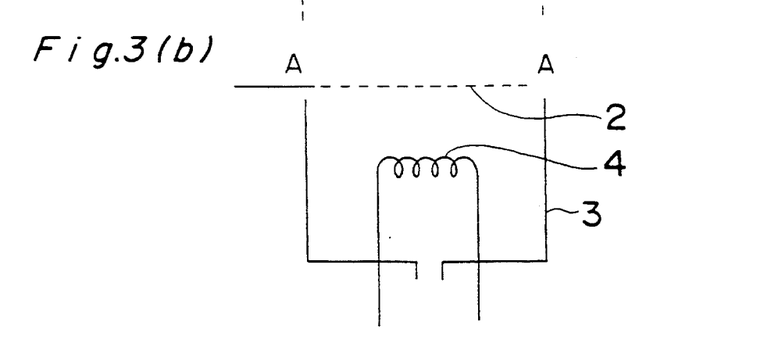

FIG. 3(a) shows the distribution of the normalized plasma density estimated from the plasma light-emitting intensity in the line A—A in FIG. 2. The distribution of the plasma density around the acceleration electrode 2 is almost constant. This shows that a uniform and high density plasma is generated.

A diamond-like thin film is deposited on the substrate 10 in the operation procedure mentioned above. Next, the properties of the film deposited on the substrate 10 is explained.

Figure 4A:
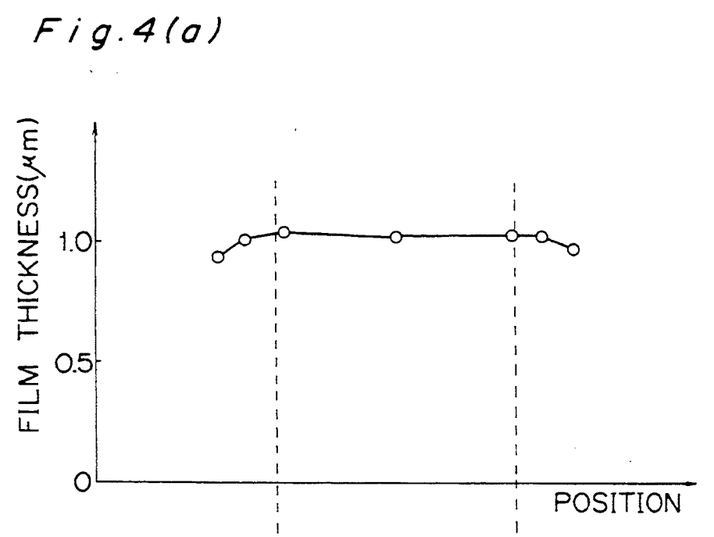
Figure 4B:
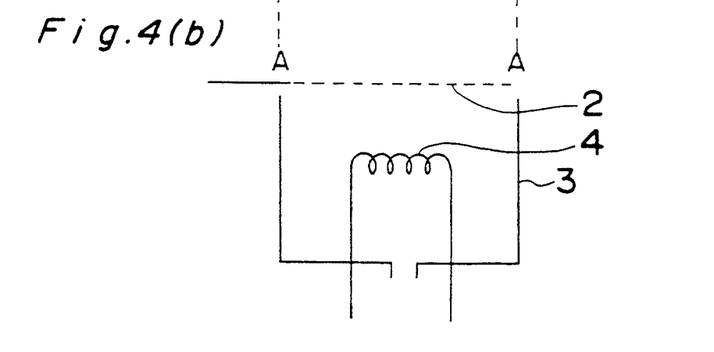

First, the homogeneity of the films deposited in the apparatus of the present embodiment is examined. FIG. 4(a) shows the distribution of the thickness of the films prepared in the apparatus of the present invention. In the film-forming region in correspondence to the opening of the chamber 3, the scattering of the film thickness is ±2% or less, and the films are found to be deposited uniformly.

Next, the results are compared when films are synthesized by using two kinds of material gas, methane and benzene. The film-forming conditions in the experiments is compiled in Table 1.

TABLE 1

| Material gas | methane, benzene |
|---|---|
| Gas pressure | $0.5 \times 10^{-3}$ Torr |
| Substrate potential | 0—−5000 V |
| Ion current density | 0.1 mA/cm$^2$ |

The kind of hydrocarbon as a material of diamond-like thin film is an important condition. A hydrocarbon gas including a plurality of carbons in a molecule is better as a material. In concrete, under a constant ion current density, benzene gas has a larger number of carbons in a molecule than methane, and has a smaller energy per carbon atom. Therefore, benzene is not liable to give damages to the ground of a film, and a diamond-like thin film can be deposited. Further, because benzene gas has a larger number of carbons in a molecule than methane, the amount of carbon supplied to the substrate 10 is larger, and a thin film can be deposited faster. Therefore, by using a hydrocarbon gas including a plurality of carbons in a molecule, an excellent carbon film on the hardness and on the deposition rate can be deposited.

Figure 5:
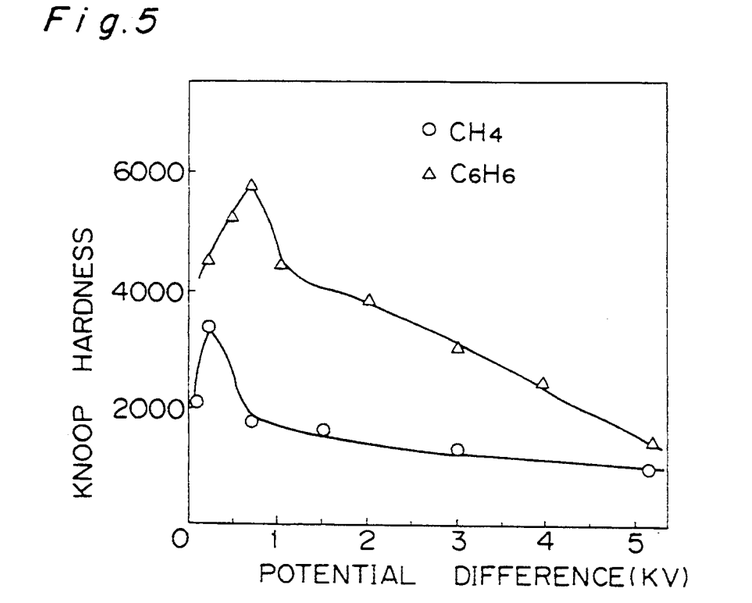
FIG. 5 is a diagram of the film hardness of films prepared in the apparatus to the potential difference.

FIG. 5 shows the relation of film hardness to the potential difference between the acceleration electrode 2 and the substrate 10. There is a tendency that the hardness has a peak at a relatively low potential difference below 1000 V for either of the material gases. Especially for benzene, Knoop hardness has 6000 and the film quality is improved Thus, one of the synthesis conditions which determine the kinetic energy of ionized particles is the potential difference between the substrate and the plasma. It is preferable that the potential of the substrate 10 is lower and the potential difference is between 100 and 5000 V. If the potential difference is 100 V or low, there is a tendency that the ion energy is too small and only a soft film is synthesized. On the other hand, there is a tendency that film quality is deteriorated if the energy is too large, and especially at 5000 V or more, that high energy ions give damages to the substrate or to the ground of film while a film is synthesized, and that the film quality becomes worse.

Figure 6:
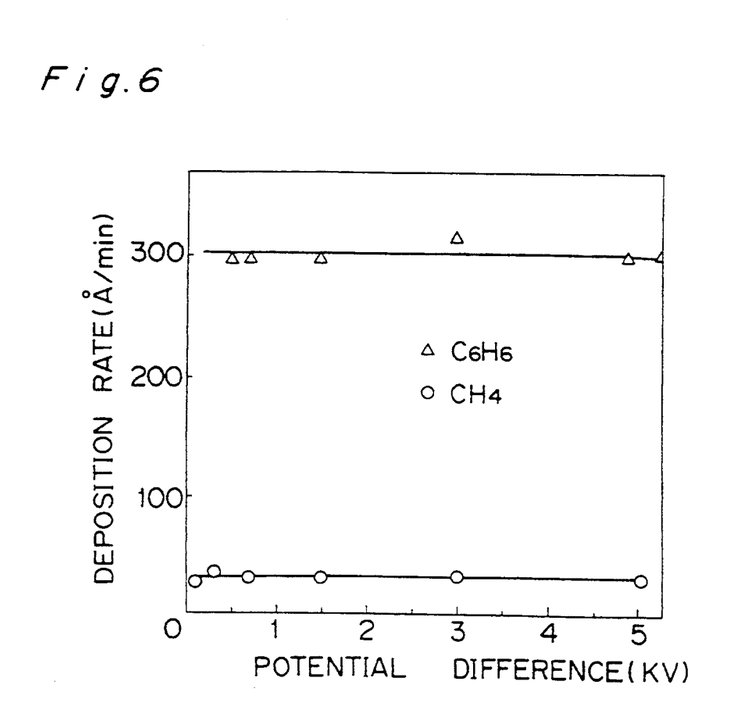
FIG. 6 is a diagram of the deposition rate of films prepared in the apparatus to the potential difference.

Next, FIG. 6 illustrates the relation of deposition rate to the potential difference when these samples are prepared. The deposition rate is constant irrespective of the potential difference, and it is large especially for benzene. This is ascribable to the number of carbons in a molecule because it is larger in benzene under a constant pressure, and the large supply amount of carbon atoms improves the deposition rate.

Next, the film quality is compared under various ion current density. The experimental conditions is compiled in Table 2.

TABLE 2

| Material gas | benzene |
|---|---|
| Gas pressure | $1.0 \times 10^{-3}$ Torr |
| Substrate potential | −3000 V |
| Ion current density | 0.01–1.0 mA/cm$^2$ |

Figure 7:
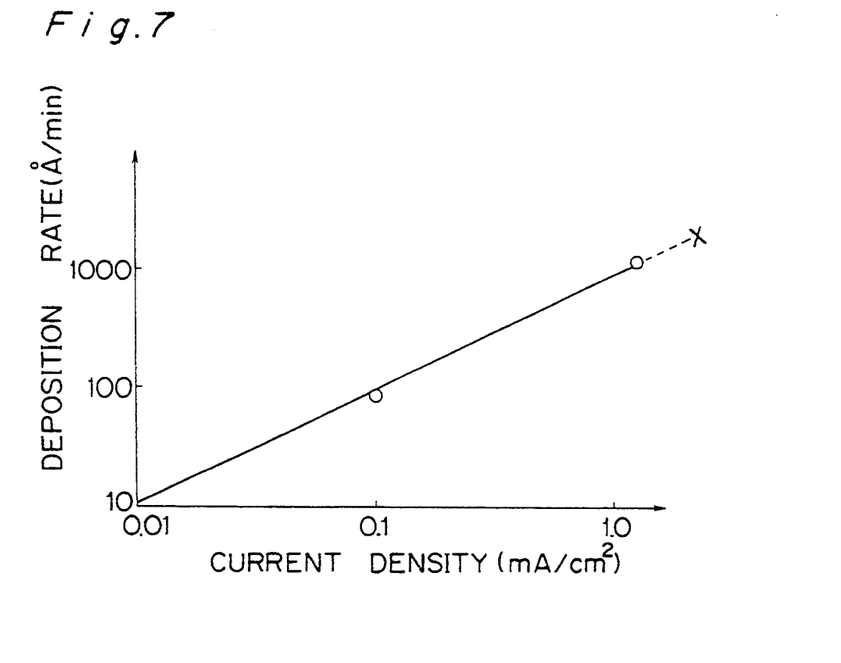
FIG. 7 is a diagram of the deposition rate of films prepared in the apparatus to the current density.
Figure 8:
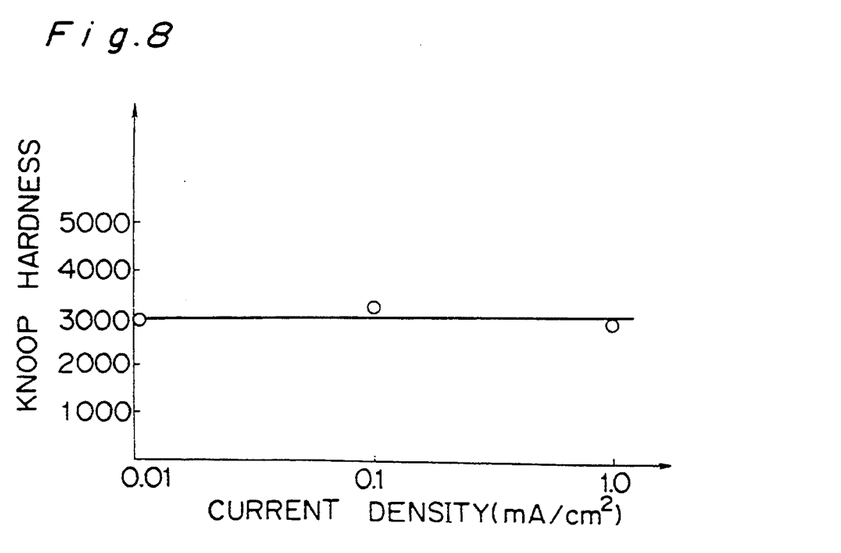
FIG. 8 is a diagram of the hardness of films prepared in the apparatus to the current density.

FIG. 7 shows the relation of the current density to the deposition rate, while FIG. 8 shows the relation of the current density to film hardness. It is found that the deposition rate is increased by maintaining the film quality when the current density is increased. However, if the current density is increased to 1.0 mA/cm$^2$ or more, the adhesive property of film becomes worse due to the concentration of electric field, and peeling off of films happens. On the other hand, if the current density is decreased to 0.01 mA/cm$^2$ or less, the deposition rate becomes too slow to be used practically.

Another important deposition condition is the current density of ionized particles irradiating the substrate (hereinafter referred to as ion current density), and it is preferable that the ion current density is between 0.01 and 1.0 mA/cm$^2$. If the ion current density is increased larger than 1.0 mA/cm$^2$, the electric field concentrates due to the ionized particles and the adhesiveness of a film is deteriorated so as for a film to be peeled off. On the other hand, if the ion current density is decreased less than 0.01 mA/cm$^2$, the amount of ionized particles decreases and the deposition rate becomes very slow.

Next, the film quality is checked while the gas pressure in the vacuum chamber 9 is changed with the gas flow rate of the introduced material gas. The experimental conditions are summarized in Table 3.

TABLE 3

| Material gas | benzene |
|---|---|
| Gas pressure | $0.5–2.2 \times 10^{-3}$ Torr |
| Substrate potential | −3000 V |
| Ion current density | 0.1 mA/cm$^2$ |

Figure 9:
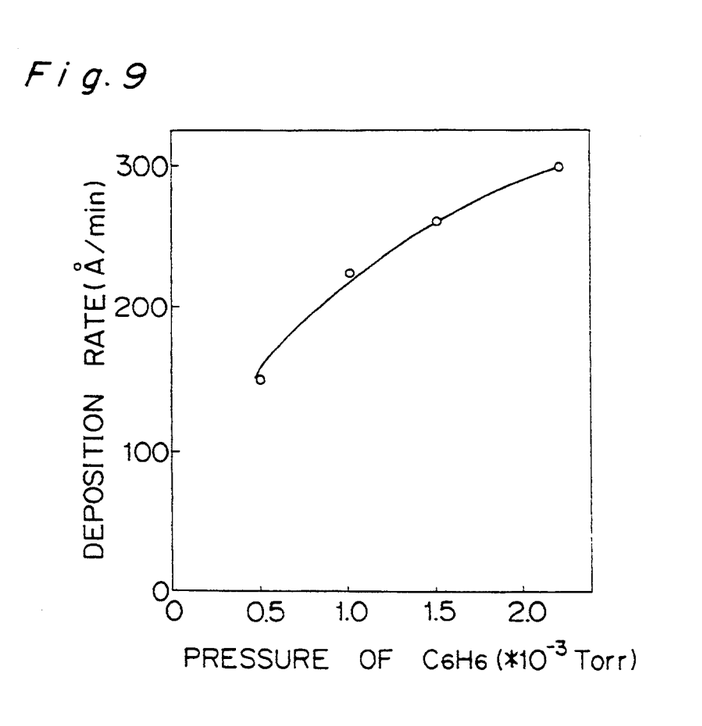
FIG. 9 is a diagram of the deposition rate of films prepared in the apparatus to the gas pressure.
Figure 10:
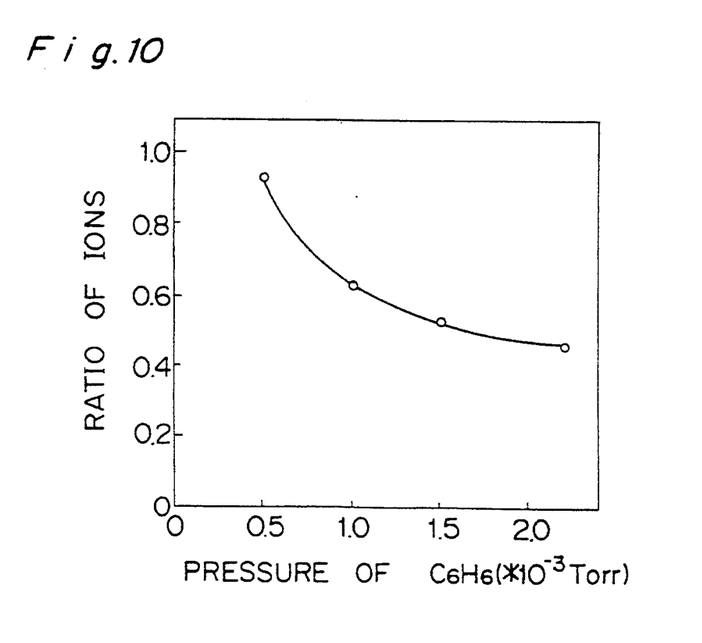
FIG. 10 is a diagram of the ion ratio of films prepared in the apparatus to the gas pressure.
Figure 11:
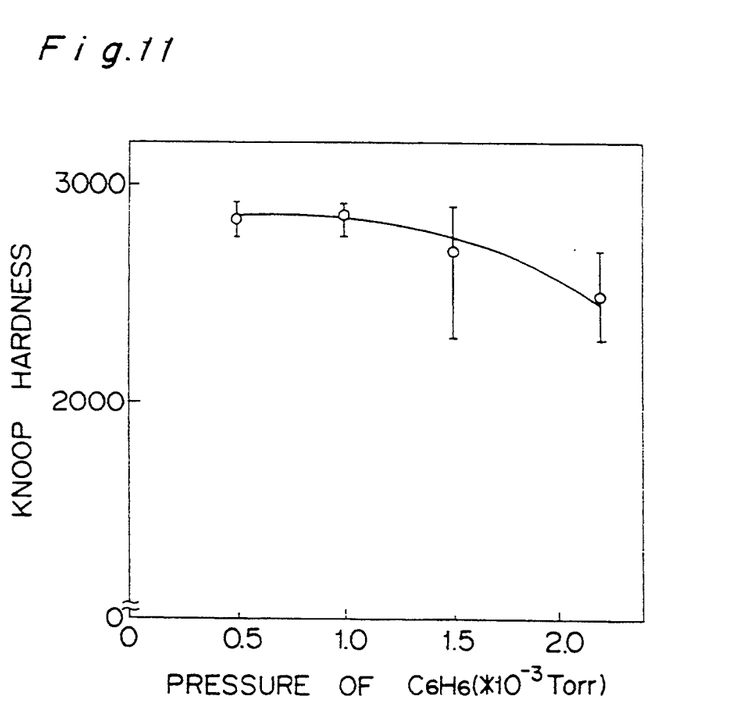
FIG. 11 is a diagram of the hardness of films prepared in the apparatus to the gas pressure.

FIG. 9 shows the relation of the gas pressure of the vacuum chamber 9 to the Knoop hardness of film. Further, FIG. 10 shows the relation of the gas pressure to the ion ratio calculated from the amount of ions which arrives the substrate 10 by using the current flowing the substrate and the deposition rate. Still further, FIG. 11 shows the relation of the gas pressure to the deposition ratio.

These drawings show that the ratio of the ions and radicals which arrive the substrate 10 varies with the gas pressure. That is, if the gas pressure is increased, the amount of radicals which arrives the substrate 10 increases and the deposition rate increases. However, it is found that the ion ratio and the film hardness decrease with increasing radicals. Thus, by forming a film at an ion ratio of at least 50%, it is found that a film of good quality can be obtained. The ratio of the ionized particles is defined as a ratio of the ionized particles to the total particles irradiating the substrate 10, and it is preferable that the ratio is 50% or more. The neutral particles may increase according to the synthesis conditions and especially if the ratio is less than 50%, the film hardness becomes lower.

In the present embodiment, diamond-like thin films are deposited for 120 minutes in various deposition conditions. The plasma extends only just above the ionized particle generator 1 in the vacuum chamber 9. Thus, spark-like anomalous discharge does not happen, and the contamination of the vacuum chamber 9 with deposits can be reduced.

In the first embodiment, when the current for the filament 4 is increased from 30 to 40 A, the deposition rate of diamond-like thin film increases to 430 Å/min. However, the plasma extends not only to above the ionized particle generator 1, but also to lateral directions, and spark-like anomalous discharge happen several times. Further, the contamination of the vacuum chamber 9 happens at the upper and lateral sides in FIG. 2.

Second embodiment

In the second invention according to the present invention, a negative potential electrode is provided to smooth the electric field intensity around the substrate, and to suppress the plasma to extend in the entire vacuum chamber. In general, if an electrode having a negative potential is positioned opposite to the plasma against the ionized particle generator near or before the substrate, the electrons in the plasma are repelled, and the ionized particles are pushed back to the plasma generator by the negative potential electrode and contained almost in the ionized particle generator. This embodiment uses this function of the electrode positively. Then, a diamond-like thin film of uniform thickness and of good quality can be deposited stably, and the vacuum chamber is not liable to be contaminated. Further, the negative potential electrode also plays a role to smooth the electric field around the substrate, so that a local concentration of electric field to the substrate can be suppressed. Then, the uniformity of the film thickness and the film quality can be improved further. The position of the negative potential electrode is determined by taking into account the potential applied to the negative potential electrode, the form of the negative potential electrode and the relative position with respect to the substrates and to the ionized particle generator.

Figure 12:
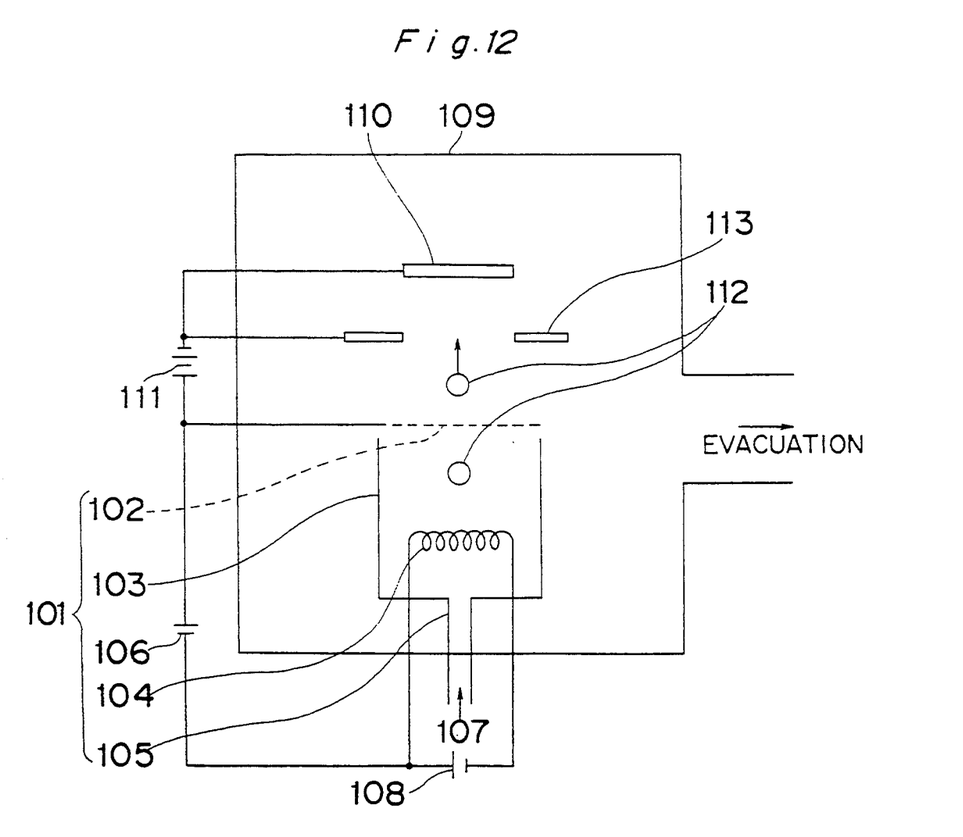
FIG. 12 is a schematic diagram of a first example of the second embodiment of an apparatus of forming diamond-like thin film.

FIG. 12 shows a structure of an apparatus of a first example of the second embodiment. First, a general structure of the deposition apparatus is explained. An ionized particle generator 101 includes an ionization chamber 103 connected to a gas inlet 105 of benzene gas 107, a coil-like tungsten filament 104 for supplying thermoelectrons and a mesh-like acceleration electrode 102 made of stainless steel for accelerating the thermoelectrons. The ionization chamber 103 may be made from an insulator or from a metal isolated electrically with insulating members (not shown). A substrate 110 is provided on a substrate holder (not shown) in the vacuum chamber 109. The substrate 110 is a silicon wafer of three inches of diameter. A negative potential electrode 113 is made of a ring-like plate of stainless steel, and the same potential as the negative potential of the substrate 110 is applied to the negative potential electrode 113. The acceleration electrode 102 applies a positive potential for accelerating ionized particles to the substrate 110 with an electric power source 111 arranged outside the vacuum chamber 109.

In the present example, the negative potential electrode 113 is positioned between the ionized particle generator 101 and the substrate 110 near the substrate 110 so as not to obstruct the deposition of ionized particles flying to the substrate 110. The negative potential electrode 113 is a hollow circular plate made of stainless steel of 3.5 inches of inner diameter, 7 inches of outer diameter and 1 mm of thickness. The same negative potential as·the substrate 110 is applied to the negative potential electrode 113.

Next, a procedure is explained of the preparation of a diamond-like thin film on the substrate 110. The synthesis procedure is the same as that in the first embodiment except that the current supplied to the filament 104 is set to be 40 V and that the same potential of −3 kV is applied both to the substrate 110 and to the negative potential electrode 113. In the conditions, the deposition rate of diamond-like thin film is 430 Å per minute. The plasma (not shown) extends only above the ionized particle generator 101 in the vacuum chamber 109 during the deposition time of 120 minutes, anomalous spark-like discharge does not happen, and the contamination of the vacuum chamber 109 with the deposition and the like is reduced. Further, even if the current for supplying the filament 104 for generating thermoelectrons is increased to 42 A, no problem happens and the deposition rate of diamond-like thin film increases to 510 Å per minute.

Figure 13A:
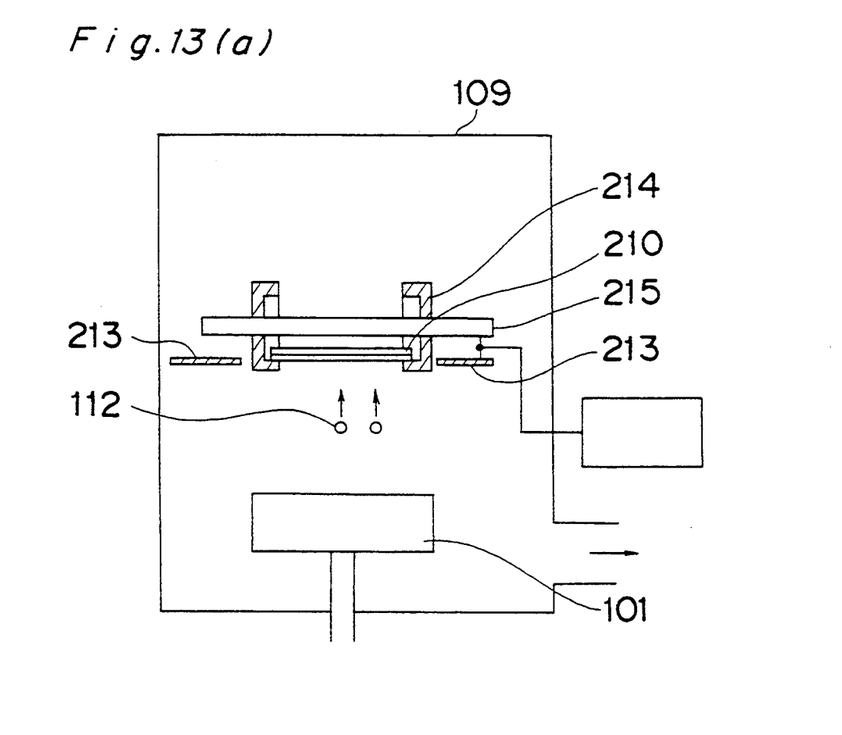
Figure 13B:
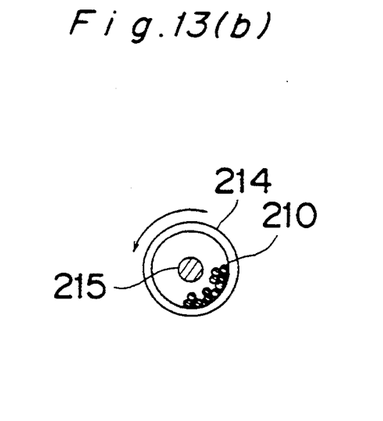
Figure 13C:
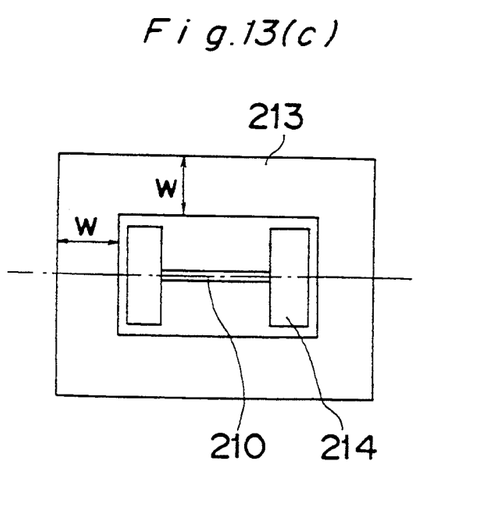

FIG. 13($a$) shows a second example of the second embodiment suitable for mass production, wherein the ionized particle generator 101 is the same as in the first example, and the synthesis conditions and the synthesis procedure are also the same as in the first example. A plurality of substrates 210 is held in a holder 214 which consists of a pair of parts connected with an axis 215, and it is arranged above the ionized particle generator 101 in the vacuum chamber 109 and holds a plurality of substrates 210 between the parts. Further, a negative potential electrode 213 of a hollow square plate of a width W is provided around the holder 214, as shown in FIG. 13($c$). The position of the negative potential electrode 213 is different from that in the first example. The form of the electrode 213 is selected to be similar to the form of the holder 214, and the width W of 3 cm is the same in the long and short sides in order to smooth the amplitude of the electric field in the both sides. The gap between the negative potential electrode 213 and the holder 214 is preferably as short as possible for the smoothing action as far as they do not contact with each other. If the potential applied to the electrode 213 is not different from that applied to the substrate 210, another power source is provided to supply a potential to the electrode 213.

In the present example, a substrate 210 is a metallic cylinder of 5 mm of diameter and 50 mm of length. A negative potential is applied to the substrates 210 via the holder 214 with the power supply 111. The cylindrical substrates 210 are held in the holder 214, and the holder 214 is started to be rotated before the start of the deposition, the substrates 210 are rotated and mixed each other, as shown in FIG. 13($b$). Then, the ionized particles are generated and accelerated to the substrates 210 to form diamond-like thin films on the substrates 210 at the same time.

It is found that the position of the negative potential electrode 213 and the applied potential to the electrode 213 affect the uniformness of the film thickness and the film quality. As to the position of the negative potential electrode 213, the negative potential electrode 213 is positioned at the same distance as the substrates 210 from the ionized particle generator 101. The reason is as follows: If the electrode 213 is set at a position nearer to the ionized particle generator 101 than the substrate 210, the electric field to the negative potential electrode 213 becomes larger than that to the substrate 210. Therefore, the ionized particles are liable to be absorbed to the electrode 213, so that the deposition rate decreases. On the other hand, if the electrode 213 is set at a position behind the substrate 210, ionized particles are liable to be concentrated to the substrates 210 and to edge portions of the holder 214. Then, the smoothing effect of the negative potential electrode 213 is not performed sufficiently.

As to the potential applied to the negative potential electrode 213, the holder 214 is connected to the electrode 213 electrically to have the same potential each other. In the present example, when the negative potential electrode 213 is positioned at the same distance as the substrates 210 from the ionized particle generator 101, if the negative potential applied to the electrode 213 is smaller than the substrates 210, ionized particles tends to be absorbed more to the substrates 210 to increase the deposition rate. However, they are liable to concentrate more to the substrates 210 and to edge portions of the holder 214. Then, the smoothing effect of the negative potential electrode 213 becomes difficult to be performed sufficiently. On the other hand, if the negative potential applied to the electrode 213 is smaller than the substrates 210, the electric field to the negative potential electrode 213 becomes larger than that to the substrates 210, and ionized particles tends to be absorbed more to the negative potential electrode 213. Thus, the deposition rate on the substrate 210 decreases. Then, the same power source 111 is used to apply a negative potential to the electrode 213 in the examples.

The position of the electrode 213 and the potential applied thereto may be selected differently from the above-mentioned ones if the electric field around the substrate is smoothed.

Third embodiment

In a deposition apparatus, a part of the ions are accelerated to the substrate, while others fly in the directions not to the substrate. If a member isolated electrically from the ground potential, the filament and the acceleration electrode surrounds the flight path of ions from the plasma to the substrate, the ions accelerated to the directions not to the substrate are prevented to proceed further by the member and the dispersion of ions except the direction to the substrate can be suppressed by the member. At this time, because the member is isolated electrically from the ground potential, the charge is conserved and the charge-up arises in the member. If the film deposition is proceeded, ions repelled from the member with the charges, to change the flight direction to the substrate. Thus, the ions concentrate more in the direction to the substrate to improve the synthesis rate and the film quality.

Figure 14:
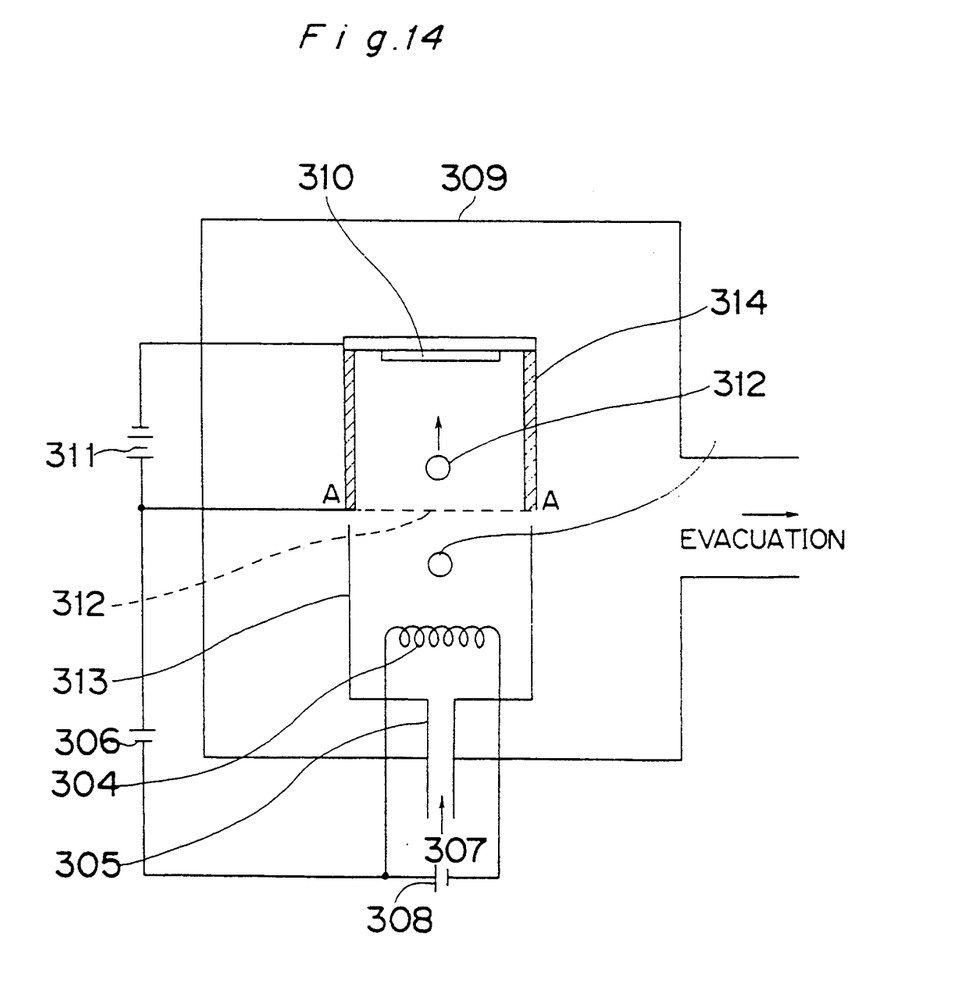
FIG. 14 is a schematic diagram of a third embodiment of an apparatus of forming a diamond-like thin film.

FIG. 14 shows a schematic structure of the apparatus of the third embodiment. An ionized particle generator 301 is arranged in the center of a vacuum chamber 309. It comprises a chamber 303 connected to a material gas inlet 305 of hydrocarbon gas 307, a coil-like tungsten filament 304 provided inside the chamber 303 for generating a plasma, and a mesh-like acceleration electrode 302 provided at the top of the chamber 303. The chamber 303 is isolated electrically from the ground potential, the filament 304 and the acceleration electrode 302, and is floated electrically. The ionization chamber 303 may be made from an insulator or from a metal insulated electrically from the vacuum chamber 301 and the acceleration electrode 302. A substrate 301 is provided above the acceleration electrode 302 on a holder (not shown) in the vacuum chamber 309. The vacuum chamber 309 can be evacuated with a vacuum pump (not shown). A cylindrical tube 314 insulated electrically from the acceleration electrode 302 and the substrate 310 is provided around a flight path of ionized particles from the plasma generated in the ionized particle generator 301 to the substrate 310. That is, the periphery of the flight path of ionized particles is surrounded by the cylindrical tube 314 which is isolated electrically from the ground potential. Among the ionized particles, there are ionized particles which fly in directions except to the substrate. The cylindrical tube 314 can suppress the dispersion of ionized particles flying in directions except to the substrate 310. That is, they are stopped to proceed further by the member 314. Though a part of the ions are accelerated in the directions not to the substrate 310, they are prevented to proceed further by the cylindrical tube 314. At this time, because the cylindrical tube 314 is isolated electrically, the charges are conserved and the charge-up in the member arises. If the film synthesis is proceeded, ions repulses the cylindrical tube 314 with the charges, to change the flight direction to the substrate 310. Thus, the ions concentrate in the direction to the substrate 310 to improve the synthesis rate and the film quality.

A direct current power source 308 supplies a current to the filament 304 for heating. An electric power source 306 arranged outside the vacuum chamber 309 applies a negative potential for acceleration to the acceleration electrode 302 relative to the filament 304. A second electric power source 311 arranged outside the vacuum chamber 309 applies a positive potential for acceleration to the substrate 310 relative to the acceleration electrode 302 to control the substrate potential.

A diamond-like thin film is deposited in the apparatus. The deposition procedure of film is the same as in the first embodiment. The experimental conditions are compiled in Table 4.

In Table 5, the deposition rate, the ion current density and the film hardness are compared between a case of the present invention and a case with use of the apparatus of FIG. 2.

These data show that ions in the plasma can be concentrated in the direction to the substrate 310, and the current density can be increased.

TABLE 4

| Material gas | benzene |
|---|---|
| Gas pressure | $0.5 \times 10^{-3}$ Torr |
| Substrate potential | −3000 V |

TABLE 5

| Apparatus | First embodiment | This embodiment |
|---|---|---|
| Deposition rate (Å/min) | 230 | 330 |
| Ion current density (mA/cm$^2$) | 0.1 | 0.14 |
| Knoop hardness | 3000 | 3000 |

In the present embodiment, the experimental conditions are not limited to those explained above. The chamber 301 or the member 314 isolated electrically from the ground potential is made of a metal or of an insulator.

Further, the plasma density can be increased by using an external magnetic field or electric field. A material gas is not limited to methane and benzene, and a supplementary gas such as argon or nitrogen may be added.

In the above-mentioned embodiments, the ionization chamber 301 is isolated electrically from the thermoelectron generator, the acceleration electrode and the ground of the electric system of the apparatus. Thus, a plasma of hydrocarbon can be generated easily in the ionization chamber.

The material gas is not limited to benzene and methane, but may be ethane, ethylene acetylene or propane. It may be mixed with an inert gas such as helium or argon. The filament may also be made from tantalum, and the form thereof may be a ring or a hair pin. The material and the form of the acceleration electrode and of the ionized particle generator may not limited to those mentioned above.

A diamond-like thin film of good quality can be synthesized homogeneously, stably and fast according to the present invention. Thus, it can be applicable to many areas such as devices and components with use of a carbon film, and it had a large advantage in industrial use.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for depositing a diamond-like thin film including an electrical system therein ground potential, said apparatus comprising:
   a vacuum chamber for providing a substrate therein;
   an ionized particle generator, provided in the vacuum chamber, for supplying ionized particles of a gas including a hydrocarbon gas; and
   an acceleration means for accelerating ionized particles generated by the ionized particle generator;
   the ionized particle generator comprising:
   an ionization chamber having an opening;
   a gas supplier, connected to the ionization chamber, for supplying the gas to the ionization chamber;
   a thermoelectron generator for generating thermoelectrons, which thermoelectron generator having a filament arranged in the ionization chamber; and
   an acceleration electrode for accelerating the thermoelectrons to generate ionized particles of the gas in the ionization chamber, which acceleration electrode being arranged at the opening of the ionization chamber opposite to the thermoelectron generator;
   wherein the ionization chamber is isolated electrically from the thermoelectron generator, the acceleration electrode and the ground potential of an electric system of the apparatus.

2. The apparatus according to claim 1, wherein said ionization chamber is made from an insulating material.

3. The apparatus according to claim 1, wherein said ionization chamber is made from a metallic material.

4. An apparatus for depositing a diamond-like thin film including an electrical system connected to ground potential, said apparatus comprising:
   a vacuum chamber for providing a substrate therein;
   an ionized particle generator, provided in the vacuum chamber, for supplying ionized particles of a gas including a hydrocarbon gas;
   an acceleration means for accelerating ionized particles generated by the ionized particle generator; and
   a negative potential electrode, provided at a position opposite to the ionized particles so as not to obstruct the deposition of said ionized particles on the substrate, which negative potential electrode has a negative potential applied thereto;
   the ionized particle generator comprising:
   an ionization chamber having an opening;
   a gas supplier, connected to the ionization chamber, for supplying the gas to the ionization chamber;
   a thermoelectron generator for generating thermoelectrons, which thermoelectron generator including a filament arranged in the ionization chamber; and
   an acceleration electrode for accelerating the thermoelectrons to generate ionized particles of the gas in the ionization chamber, which acceleration electrode being arranged at the opening of the ionization chamber opposite to the thermoelectron generator;
   wherein the ionization chamber is isolated electrically from the thermoelectron generator, the acceleration electrode and the ground potential of an electric system of the apparatus.

5. The apparatus according to claim 4, wherein said negative potential electrode is made of a hollow flat plate and the form of the inside of the hollow flat plate is substantially the same as the form of said substrate when observed from said ionized particle generator.

6. The apparatus according to claim 5, wherein said negative potential electrode is provided in front of the substrate when observed from the ionized particle generator and has the same electric potential as the substrate.

7. The apparatus according to claim 4, further comprising a substrate holder for holding a plurality of cylindrical substrates; which substrate holder comprising a pair of cylindrical parts each having a recess, which pair of cylindrical parts being connected with an axis to hold a plurality of cylindrical substrates between the recesses.

8. The apparatus according to claim 7, wherein said negative potential electrode is made of a hollow flat plate having substantially the same form as said cylindrical parts connected by said axis.

9. The apparatus according to claim 7, wherein said negative potential electrode is provided at the same distance from the ionized particle supplier as the substrate's distance from the ionized particle supplier and has the same electric potential as the substrates.

10. The apparatus according to claim 4, wherein said ionization chamber is made from an insulating material.

11. The apparatus according to claim 4, wherein said ionization chamber is made from a metallic material.

12. An apparatus for depositing a diamond-like thin film including an electrical system operating at a given ground potential, said apparatus comprising:
   a vacuum chamber for providing a substrate therein;

an ionized particle generator, provided in the vacuum chamber, for supplying ionized particles of a gas including a hydrocarbon gas to said substrate;

a member for surrounding the path of ionized particles from the ionized particle generator to the substrate, which member being isolated electrically from the ground potential of an electric system of the apparatus; and an acceleration means for accelerating ionized particles generated by the ionized particle generator;

the ionized particle generator comprising:

an ionization chamber having an opening;

a gas supplier, connected to the ionization chamber, for supplying the gas to the ionization chamber;

a thermoelectron generator for generating thermoelectrons, which thermoelectron generator including a filament arranged in the ionization chamber; and an acceleration electrode for accelerating the thermoelectrons to generate ionized particles of the gas in the ionization chamber, which acceleration electrode being arranged at the opening of the ionization chamber opposite to the thermoelectron generator;

wherein the ionization chamber is isolated electrically from the thermoelectron generator, the acceleration electrode and the ground potential of an electric system of the apparatus.

13. The apparatus according to claim 12, wherein said member is made from an insulating material.

14. The apparatus according to claim 12, wherein said member is made from a metallic material, which member being insulated from the acceleration electrode and the substrate.

15. The apparatus according to claim 12, wherein said ionization chamber is made from an insulating material.

16. The apparatus according to claim 12, wherein said ionization chamber is made from a metallic material.

* * * * *